(12) United States Patent
Khlat

(10) Patent No.: US 11,349,436 B2
(45) Date of Patent: May 31, 2022

(54) ENVELOPE TRACKING INTEGRATED CIRCUIT

(71) Applicant: Qorvo US, Inc., Greensboro, NC (US)

(72) Inventor: Nadim Khlat, Cugnaux (FR)

(73) Assignee: QORVO US, INC., Greensboro, NC (US)

( * ) Notice: Subject to any disclaimer, the term of this patent is extended or adjusted under 35 U.S.C. 154(b) by 91 days.

(21) Appl. No.: 16/855,154

(22) Filed: Apr. 22, 2020

(65) Prior Publication Data

US 2020/0382066 A1  Dec. 3, 2020

Related U.S. Application Data

(60) Provisional application No. 62/854,581, filed on May 30, 2019.

(51) Int. Cl.
*H03G 3/20* (2006.01)
*H03F 1/02* (2006.01)
(Continued)

(52) U.S. Cl.
CPC ............. *H03F 1/0233* (2013.01); *H03F 3/20* (2013.01); *H03F 3/68* (2013.01); *G05F 1/46* (2013.01);
(Continued)

(58) Field of Classification Search
CPC .... H03F 1/0222; H03F 1/0227; H03F 1/0233; H03F 1/0238
(Continued)

(56) References Cited

U.S. PATENT DOCUMENTS

| 5,510,753 A | 4/1996 | French |
| 5,838,732 A | 11/1998 | Carney |

(Continued)

FOREIGN PATENT DOCUMENTS

| EP | 3174199 A2 | 5/2017 |
| JP | H03104422 A | 5/1991 |

(Continued)

OTHER PUBLICATIONS

Final Office Action for U.S. Appl. No. 16/122,611, dated Sep. 18, 2020, 17 pages.

(Continued)

*Primary Examiner* — Steven J Mottola
(74) *Attorney, Agent, or Firm* — Withrow & Terranova, P.L.L.C.

(57) ABSTRACT

An envelope tracking integrated circuit having a tracker circuitry configured to generate a modulated supply voltage for a radio frequency power amplifier in response to an envelope of a radio frequency signal to be amplified by the radio frequency power amplifier is disclosed. Also included is a charge pump system configured to generate a tracker supply voltage for the tracker circuitry. Further included is an analog multiplexer configured to receive the tracker supply voltage and a battery source voltage and output a selected one of the tracker supply voltage and the battery source voltage in response to a voltage select signal. A digital processor further included in the envelope tracking integrated circuit is configured to control portions of the tracker circuitry and be powered by the selected one of the tracker supply voltage and the battery source voltage during transmission gaps when the radio frequency signal is not transmitted.

21 Claims, 5 Drawing Sheets

(51) Int. Cl.
*H03F 3/20* (2006.01)
*H03F 3/68* (2006.01)
H03F 3/45 (2006.01)
H02M 3/07 (2006.01)
G05F 1/46 (2006.01)

(52) U.S. Cl.
CPC ............... *H02M 3/07* (2013.01); *H03F 3/45* (2013.01); *H03F 2200/102* (2013.01); *H03F 2200/451* (2013.01)

(58) Field of Classification Search
USPC ................................................. 330/127, 136
See application file for complete search history.

(56) References Cited

U.S. PATENT DOCUMENTS

| | | |
|---|---|---|
| 6,107,862 A | 8/2000 | Mukainakano et al. |
| 6,141,377 A | 10/2000 | Sharper et al. |
| 6,141,541 A | 10/2000 | Midya et al. |
| 6,411,531 B1 | 10/2000 | Midya et al. |
| 6,985,033 B1 | 1/2006 | Shirali et al. |
| 7,043,213 B2 | 5/2006 | Robinson et al. |
| 7,471,155 B1 | 12/2008 | Levesque |
| 7,570,931 B2 | 8/2009 | McCallister et al. |
| 7,994,862 B1 | 8/2011 | Pukhovski |
| 8,461,928 B2 | 6/2013 | Yahav et al. |
| 8,493,141 B2 | 7/2013 | Khlat et al. |
| 8,519,788 B2 | 8/2013 | Khlat |
| 8,588,713 B2 | 11/2013 | Khlat |
| 8,718,188 B2 | 5/2014 | Balteanu et al. |
| 8,723,492 B2 | 5/2014 | Korzeniowski |
| 8,725,218 B2 | 5/2014 | Brown et al. |
| 8,774,065 B2 | 7/2014 | Khlat et al. |
| 8,803,603 B2 | 8/2014 | Wimpenny |
| 8,818,305 B1 | 8/2014 | Schwent et al. |
| 8,854,129 B2 | 10/2014 | Wilson |
| 8,879,665 B2 | 11/2014 | Xia et al. |
| 8,913,690 B2 | 12/2014 | Onishi |
| 8,989,682 B2 | 3/2015 | Ripley et al. |
| 9,018,921 B2 | 4/2015 | Gurlahosur |
| 9,020,451 B2 | 4/2015 | Khlat |
| 9,041,364 B2 | 5/2015 | Khlat |
| 9,041,365 B2 | 5/2015 | Kay et al. |
| 9,055,529 B2 | 6/2015 | Shih |
| 9,065,509 B1 | 6/2015 | Yan et al. |
| 9,069,365 B2 | 6/2015 | Brown et al. |
| 9,098,099 B2 | 8/2015 | Park et al. |
| 9,166,538 B2 | 10/2015 | Hong et al. |
| 9,166,830 B2 | 10/2015 | Camuffo et al. |
| 9,167,514 B2 | 10/2015 | Dakshinamurthy et al. |
| 9,197,182 B2 | 11/2015 | Baxter et al. |
| 9,225,362 B2 | 12/2015 | Drogi et al. |
| 9,247,496 B2 | 1/2016 | Khlat |
| 9,263,997 B2 | 2/2016 | Vinayak |
| 9,270,230 B2 | 2/2016 | Henshaw et al. |
| 9,270,239 B2 | 2/2016 | Drogi et al. |
| 9,271,236 B2 | 2/2016 | Drogi |
| 9,280,163 B2 | 3/2016 | Kay et al. |
| 9,288,098 B2 | 3/2016 | Yan et al. |
| 9,298,198 B2 | 3/2016 | Kay et al. |
| 9,344,304 B1 | 5/2016 | Cohen |
| 9,356,512 B2 | 5/2016 | Chowdhury et al. |
| 9,377,797 B2 | 6/2016 | Kay et al. |
| 9,379,667 B2 | 6/2016 | Khlat et al. |
| 9,445,371 B2 | 9/2016 | Khesbak et al. |
| 9,515,622 B2 | 12/2016 | Nentwig et al. |
| 9,520,907 B2 | 12/2016 | Peng et al. |
| 9,584,071 B2 | 2/2017 | Khlat |
| 9,595,869 B2 | 3/2017 | Lerdworatawee |
| 9,595,981 B2 | 3/2017 | Khlat |
| 9,596,110 B2 | 3/2017 | Jiang et al. |
| 9,614,477 B1 | 4/2017 | Rozenblit et al. |
| 9,634,666 B2 | 4/2017 | Krug |
| 9,748,845 B1 | 8/2017 | Kotikalapoodi |
| 9,806,676 B2 | 10/2017 | Balteanu et al. |
| 9,831,834 B2 | 11/2017 | Balteanu et al. |
| 9,837,962 B2 | 12/2017 | Mathe et al. |
| 9,923,520 B1 | 3/2018 | Abdelfattah et al. |
| 10,003,416 B1 | 6/2018 | Lloyd |
| 10,090,808 B1 | 10/2018 | Henzler et al. |
| 10,097,145 B1 | 10/2018 | Khlat et al. |
| 10,103,693 B2 | 10/2018 | Zhu et al. |
| 10,110,169 B2 | 10/2018 | Khesbak et al. |
| 10,158,329 B1 | 12/2018 | Khlat |
| 10,158,330 B1 | 12/2018 | Khlat |
| 10,170,989 B2 | 1/2019 | Balteanu et al. |
| 10,291,181 B2 | 5/2019 | Kim et al. |
| 10,326,408 B2 | 6/2019 | Khlat et al. |
| 10,382,071 B2 | 8/2019 | Rozek et al. |
| 10,476,437 B2 | 11/2019 | Nag et al. |
| 10,862,431 B1 | 12/2020 | Khlat |
| 10,879,804 B2 | 12/2020 | Kim et al. |
| 11,050,433 B1 | 6/2021 | Melanson et al. |
| 11,121,684 B2 | 9/2021 | Henzler et al. |
| 11,128,261 B2 | 9/2021 | Ranta et al. |
| 2002/0167827 A1 | 11/2002 | Umeda et al. |
| 2003/0107428 A1 | 6/2003 | Khouri et al. |
| 2004/0266366 A1 | 12/2004 | Robinson et al. |
| 2005/0090209 A1 | 4/2005 | Behzad |
| 2005/0227646 A1 | 10/2005 | Yamazaki et al. |
| 2005/0232385 A1 | 10/2005 | Yoshikawa et al. |
| 2006/0028271 A1 | 2/2006 | Wilson |
| 2006/0240786 A1 | 10/2006 | Liu |
| 2007/0052474 A1 | 3/2007 | Saito |
| 2007/0258602 A1 | 11/2007 | Vepsalainen et al. |
| 2008/0116960 A1 | 5/2008 | Nakamura |
| 2009/0016085 A1 | 1/2009 | Rader et al. |
| 2009/0045872 A1 | 2/2009 | Kenington |
| 2009/0191826 A1 | 7/2009 | Takinami et al. |
| 2010/0283534 A1 | 11/2010 | Pierdomenico |
| 2010/0308919 A1 | 12/2010 | Adamski et al. |
| 2011/0074373 A1 | 3/2011 | Lin |
| 2011/0136452 A1 | 6/2011 | Pratt et al. |
| 2011/0175681 A1 | 7/2011 | Inamori et al. |
| 2011/0279179 A1 | 11/2011 | Vice |
| 2012/0194274 A1 | 8/2012 | Fowers et al. |
| 2012/0200435 A1 | 8/2012 | Ngo et al. |
| 2012/0299645 A1 | 11/2012 | Southcombe et al. |
| 2012/0299647 A1 | 11/2012 | Honjo et al. |
| 2013/0021827 A1 | 1/2013 | Ye |
| 2013/0100991 A1 | 4/2013 | Woo |
| 2013/0127548 A1 | 5/2013 | Popplewell et al. |
| 2013/0130724 A1 | 5/2013 | Kumar Reddy et al. |
| 2013/0162233 A1 | 6/2013 | Marty |
| 2013/0187711 A1 | 7/2013 | Goedken et al. |
| 2013/0200865 A1 | 8/2013 | Wimpenny |
| 2013/0271221 A1 | 10/2013 | Levesque et al. |
| 2014/0009226 A1 | 1/2014 | Severson |
| 2014/0028370 A1 | 1/2014 | Wimpenny |
| 2014/0028390 A1 | 1/2014 | Davis |
| 2014/0057684 A1 | 2/2014 | Khlat |
| 2014/0103995 A1 | 4/2014 | Langer |
| 2014/0155002 A1 | 6/2014 | Dakshinamurthy et al. |
| 2014/0184335 A1 | 7/2014 | Nobbe et al. |
| 2014/0199949 A1 | 7/2014 | Nagode et al. |
| 2014/0203869 A1* | 7/2014 | Khlat ............... H03F 1/0266 330/75 |
| 2014/0210550 A1 | 7/2014 | Mathe et al. |
| 2014/0218109 A1 | 8/2014 | Wimpenny |
| 2014/0235185 A1 | 8/2014 | Drogi |
| 2014/0266423 A1 | 9/2014 | Drogi et al. |
| 2014/0266428 A1 | 9/2014 | Chiron et al. |
| 2014/0315504 A1 | 10/2014 | Sakai et al. |
| 2014/0361830 A1 | 12/2014 | Mathe et al. |
| 2014/0361837 A1 | 12/2014 | Strange et al. |
| 2015/0048883 A1 | 2/2015 | Vinayak |
| 2015/0071382 A1 | 3/2015 | Wu et al. |
| 2015/0098523 A1 | 4/2015 | Lim et al. |
| 2015/0139358 A1 | 5/2015 | Asuri et al. |
| 2015/0155836 A1 | 6/2015 | Midya et al. |
| 2015/0188432 A1 | 7/2015 | Vannorsdel et al. |
| 2015/0236652 A1 | 8/2015 | Yang et al. |
| 2015/0236654 A1 | 8/2015 | Jiang et al. |

(56) References Cited

U.S. PATENT DOCUMENTS

| | | |
|---|---|---|
| 2015/0236729 A1 | 8/2015 | Peng et al. |
| 2015/0280652 A1 | 10/2015 | Cohen |
| 2015/0333781 A1 | 11/2015 | Alon et al. |
| 2016/0050629 A1 | 2/2016 | Khesbak et al. |
| 2016/0065137 A1 | 3/2016 | Khlat |
| 2016/0099686 A1 | 4/2016 | Perreault et al. |
| 2016/0099687 A1 | 4/2016 | Khlat |
| 2016/0105151 A1 | 4/2016 | Langer |
| 2016/0118941 A1 | 4/2016 | Wang |
| 2016/0126900 A1 | 5/2016 | Shute |
| 2016/0173031 A1 | 6/2016 | Langer |
| 2016/0181995 A1 | 6/2016 | Nentwig et al. |
| 2016/0187627 A1 | 6/2016 | Abe |
| 2016/0197627 A1 | 7/2016 | Qin et al. |
| 2016/0226448 A1 | 8/2016 | Wimpenny |
| 2016/0294587 A1 | 10/2016 | Jiang et al. |
| 2017/0012675 A1 | 1/2017 | Frederick |
| 2017/0141736 A1 | 5/2017 | Pratt et al. |
| 2017/0302183 A1 | 10/2017 | Young |
| 2017/0317913 A1 | 11/2017 | Kim et al. |
| 2017/0338773 A1 | 11/2017 | Balteanu et al. |
| 2018/0013465 A1 | 1/2018 | Chiron et al. |
| 2018/0048265 A1 | 2/2018 | Nentwig |
| 2018/0048276 A1 | 2/2018 | Khlat et al. |
| 2018/0076772 A1 | 3/2018 | Khesbak et al. |
| 2018/0123453 A1 | 5/2018 | Puggelli et al. |
| 2018/0152144 A1 | 5/2018 | Choo et al. |
| 2018/0288697 A1 | 10/2018 | Camuffo et al. |
| 2018/0302042 A1 | 10/2018 | Zhang et al. |
| 2018/0309414 A1 | 10/2018 | Khlat et al. |
| 2018/0367101 A1 | 12/2018 | Chen et al. |
| 2018/0375476 A1 | 12/2018 | Balteanu et al. |
| 2019/0028060 A1 | 1/2019 | Jo et al. |
| 2019/0044480 A1 | 2/2019 | Khlat |
| 2019/0068234 A1 | 2/2019 | Khlat et al. |
| 2019/0097277 A1 | 3/2019 | Fukae |
| 2019/0109566 A1 | 4/2019 | Folkmann et al. |
| 2019/0109613 A1 | 4/2019 | Khlat et al. |
| 2019/0222178 A1 | 7/2019 | Khlat et al. |
| 2019/0229623 A1 | 7/2019 | Tsuda et al. |
| 2019/0238095 A1 | 8/2019 | Khlat |
| 2019/0253023 A1 | 8/2019 | Yang et al. |
| 2019/0267956 A1 | 8/2019 | Granger-Jones et al. |
| 2019/0222175 A1 | 10/2019 | Khlat et al. |
| 2020/0007090 A1 | 1/2020 | Khlat et al. |
| 2020/0036337 A1 | 1/2020 | Khlat |
| 2020/0106392 A1 | 4/2020 | Khlat et al. |
| 2020/0136561 A1 | 4/2020 | Khlat et al. |
| 2020/0136563 A1 | 4/2020 | Khlat |
| 2020/0136575 A1 | 4/2020 | Khlat et al. |
| 2020/0144966 A1 | 5/2020 | Khlat |
| 2020/0153394 A1 | 5/2020 | Khlat et al. |
| 2020/0177131 A1 | 6/2020 | Khlat |
| 2020/0204116 A1 | 6/2020 | Khlat |
| 2020/0228063 A1 | 7/2020 | Khlat |
| 2020/0259456 A1 | 8/2020 | Khlat |
| 2020/0259685 A1 | 8/2020 | Khlat |
| 2020/0266766 A1 | 8/2020 | Khlat et al. |
| 2021/0159590 A1 | 5/2021 | Na et al. |
| 2021/0194515 A1 | 6/2021 | Go et al. |

FOREIGN PATENT DOCUMENTS

| | | |
|---|---|---|
| WO | 2018182778 A1 | 10/2018 |
| WO | 2020206246 A1 | 10/2020 |
| WO | 2021046453 A1 | 3/2021 |

OTHER PUBLICATIONS

Notice of Allowance for U.S. Appl. No. 16/246,859, dated Sep. 18, 2020, 8 pages.
Quayle Action for U.S. Appl. No. 16/421,905, mailed Aug. 25, 2020, 5 pages.
Non-Final Office Action for U.S. Appl. No. 16/774,060, dated Aug. 17, 2020, 6 pages.
Notice of Allowance for U.S. Appl. No. 16/122,611, dated Dec. 1, 2020, 9 pages.
Advisory Action for U.S. Appl. No. 16/174,535, dated Sep. 24, 2020, 3 pages.
Notice of Allowance for U.S. Appl. No. 16/174,535, dated Oct. 29, 2020, 7 pages.
Final Office Action for U.S. Appl. No. 16/284,023, dated Nov. 3, 2020, 7 pages.
Non-Final Office Action for U.S. Appl. No. 16/416,812, dated Oct. 16, 2020, 8 pages.
Non-Final Office Action for U.S. Appl. No. 16/514,051, dated Nov. 13, 2020, 9 pages.
Quayle Action for U.S. Appl. No. 16/589,940, mailed Dec. 4, 2020, 8 pages.
Non-Final Office Action for U.S. Appl. No. 14/836,634, dated May 16, 2016, 9 pages.
Non-Final Office Action for U.S. Appl. No. 14/868,890, dated Jul. 14, 2016, 13 pages.
Non-Final Office Action for U.S. Appl. No. 15/792,909, dated May 18, 2018, 13 pages.
Notice of Allowance for U.S. Appl. No. 15/459,449, dated Mar. 28, 2018, 7 pages.
Notice of Allowance for U.S. Appl. No. 15/723,460, dated Jul. 24, 2018, 8 pages.
Notice of Allowance for U.S. Appl. No. 15/704,131, dated Jul. 17, 2018, 7 pages.
Notice of Allowance for U.S. Appl. No. 15/728,202, dated Aug. 2, 2018, 7 pages.
Non-Final Office Action for U.S. Appl. No. 15/888,300, dated Aug. 28, 2018, 11 pages.
Notice of Allowance for U.S. Appl. No. 15/792,909, dated Dec. 19, 2018, 11 pages.
Notice of Allowance for U.S. Appl. No. 15/993,705, dated Oct. 31, 2018, 7 pages.
Pfister, Henry, "Discrete-Time Signal Processing," Lecture Note, pfister.ee.duke.edu/courses/ece485/dtsp.pdf, Mar. 3, 2017, 22 pages.
Non-Final Office Action for U.S. Appl. No. 15/888,260, dated May 2, 2019, 14 pages.
Non-Final Office Action for U.S. Appl. No. 15/986,948, dated Mar. 28, 2019, 8 pages.
Non-Final Office Action for U.S. Appl. No. 16/018,426, dated Apr. 11, 2019, 11 pages.
Supplemental Notice of Allowability for U.S. Appl. No. 15/902,244, dated Mar. 20, 2019, 6 pages.
Notice of Allowance for U.S. Appl. No. 15/902,244, dated Feb. 8, 2019, 8 pages.
Advisory Action for U.S. Appl. No. 15/888,300, dated Jun. 5, 2019, 3 pages.
Notice of Allowance for U.S. Appl. No. 15/984,566, dated May 21, 2019, 6 pages.
Notice of Allowance for U.S. Appl. No. 16/150,556, dated Jul. 29, 2019, 7 pages.
Non-Final Office Action for U.S. Appl. No. 15/888,300, dated Jun. 27, 2019, 17 pages.
Final Office Action for U.S. Appl. No. 15/986,948, dated Aug. 27, 2019, 9 pages.
Advisory Action for U.S. Appl. No. 15/986,948, dated Nov. 8, 2019, 3 pages.
Notice of Allowance for U.S. Appl. No. 15/986,948, dated Dec. 13, 2019, 7 pages.
Final Office Action for U.S. Appl. No. 16/018,426, dated Sep. 4, 2019, 12 pages.
Advisory Action for U.S. Appl. No. 16/018,426, dated Nov. 19, 2019, 3 pages.
Notice of Allowance for U.S. Appl. No. 16/180,887, dated Jan. 13, 2020, 8 pages.
Notice of Allowance for U.S. Appl. No. 15/888,300, dated Jan. 14, 2020, 11 pages.
Non-Final Office Action for U.S. Appl. No. 16/122,611, dated Mar. 11, 2020, 16 pages.

(56) References Cited

OTHER PUBLICATIONS

Corrected Notice of Allowability for U.S. Appl. No. 15/888,300, dated Feb. 25, 2020, 7 pages.
Notice of Allowance for U.S. Appl. No. 16/018,426, dated Mar. 31, 2020, 7 pages.
Non-Final Office Action for U.S. Appl. No. 16/174,535, dated Feb. 4, 2020, 7 pages.
Quayle Action for U.S. Appl. No. 16/354,234, mailed Mar. 6, 2020, 8 pages.
Notice of Allowance for U.S. Appl. No. 16/354,234, dated Apr. 24, 2020, 9 pages.
Non-Final Office Action for U.S. Appl. No. 16/246,859, dated Apr. 28, 2020, 9 pages.
Corrected Notice of Allowability for U.S. Appl. No. 15/888,300, dated May 13, 2020, 7 pages.
Notice of Allowance for U.S. Appl. No. 16/155,127, dated Jun. 1, 2020, 8 pages.
Final Office Action for U.S. Appl. No. 16/174,535, dated Jul. 1, 2020, 7 pages.
Non-Final Office Action for U.S. Appl. No. 16/284,023, dated Jun. 24, 2020, 7 pages.
Non-Final Office Action for U.S. Appl. No. 16/435,940, dated Jul. 23, 2020, 6 pages.
Final Office Action for U.S. Appl. No. 15/888,300, dated Feb. 15, 2019, 15 pages.
Notice of Allowance for U.S. Appl. No. 16/122,611, dated Jan. 13, 2021, 8 pages.
Notice of Allowance for U.S. Appl. No. 16/284,023, dated Jan. 19, 2021, 7 pages.
Notice of Allowance for U.S. Appl. No. 16/416,812, dated Feb. 16, 2021, 8 pages.
Non-Final Office Action for U.S. Appl. No. 16/689,236 dated Mar. 2, 2021, 15 pages.
Notice of Allowance for U.S. Appl. No. 16/435,940, dated Dec. 21, 2020, 7 pages.
Notice of Allowance for U.S. Appl. No. 16/774,060, dated Feb. 3, 2021, 7 pages.
Notice of Allowance for U.S. Appl. No. 16/590,790, dated Jan. 27, 2021, 7 pages.
Notice of Allowance for U.S. Appl. No. 16/661,061, dated Feb. 10, 2021, 7 pages.
Notice of Allowance for U.S. Appl. No. 16/122,611, dated Apr. 1, 2021, 8 pages.
Notice of Allowance for U.S. Appl. No. 16/689,236 dated Jun. 9, 2021, 7 pages.
Non-Final Office Action for U.S. Appl. No. 16/775,554, dated Jun. 14, 2021, 5 pages.
Non-Final Office Action for U.S. Appl. No. 16/582,471, dated Mar. 24, 2021, 11 pages.
Non-Final Office Action for U.S. Appl. No. 16/597,952, dated May 26, 2021, 7 pages.
Wan, F. et al., "Negative Group Delay Theory of a Four-Port RC-Network Feedback Operational Amplifier," IEEE Access, vol. 7, Jun. 13, 2019, IEEE, 13 pages.
Notice of Allowance for U.S. Appl. No. 16/582,471, dated Jun. 22, 2021, 9 pages.
Notice of Allowance for U.S. Appl. No. 16/834,049, dated Jun. 24, 2021, 8 pages.
Notice of Allowance for U.S. Appl. No. 17/011,313, dated Nov. 4, 2021, 8 pages.
Non-Final Office Action for U.S. Appl. No. 16/597,952, dated Nov. 10, 2021, 9 pages.
Notice of Allowance for U.S. Appl. No. 17/115,982, dated Nov. 12, 2021, 8 pages.
Non-Final Office Action for U.S. Appl. No. 17/126,561, dated Oct. 14, 2021, 6 pages.
Non-Final Office Action for U.S. Appl. No. 17/073,764, dated Dec. 24, 2021, 22 pages.
Notice of Allowance for U.S. Appl. No. 16/582,471, dated Feb. 1, 2022, 9 pages.
Non-Final Office Action for U.S. Appl. No. 16/807,575, dated Jan. 31, 2022, 12 pages.
International Search Report and Written Opinion for International Patent Application No. PCT/US2021/050892, dated Jan. 5, 2022, 20 pages.
International Search Report and Written Opinion for International Patent Application No. PCT/US2021/052151, dated Jan. 4, 2022, 16 pages.
International Search Report and Written Opinion for International Patent Application No. PCT/US2021/054141 dated Jan. 25, 2022, 15 pages.
Non-Final Office Action for U.S. Appl. No. 17/032,553, dated Mar. 21, 2022, 4 pages.
International Search Report and Written Opinion for International Patent Application No. PCT/US2021/052830, dated Jan. 24, 2022, 13 pages.

* cited by examiner

ENVELOPE TRACKING INTEGRATED CIRCUIT

RELATED APPLICATIONS

This application claims the benefit of provisional patent application Ser. No. 62/854,581, filed May 30, 2019, the disclosure of which is hereby incorporated herein by reference in its entirety.

FIELD OF THE DISCLOSURE

The embodiments disclosed herein relate to power management systems for supplying power to radio frequency amplifiers.

BACKGROUND

Mobile communication devices have become increasingly common in current society for providing wireless communication services. The prevalence of these mobile communication devices is driven in part by the many functions that are now enabled on such devices. Increased processing capabilities in such devices means that mobile communication devices have evolved from being pure communication tools to being sophisticated mobile multimedia centers that enable enhanced user experiences.

The redefined user experience requires a higher data rate offered by wireless communication technologies, such as fifth-generation new radio (5G-NR) and wireless fidelity (Wi-Fi) that typically operate in higher frequency spectrums. To achieve higher data rates with increased robustness in the higher frequency spectrums, sophisticated power amplifiers may be employed to increase output power of radio frequency signals while maintaining sufficient energy per bit prior to transmitting the radio frequency signals.

Envelope tracking is a power management technology designed to improve efficiency levels of the power amplifiers to help reduce power dissipation in the mobile communication devices. An envelope tracking integrated circuit (ETIC) is configured to generate a modulated voltage that keeps track of a target voltage envelope and provides the modulated voltage to the power amplifiers for amplifying the radio frequency signal(s). However, present ETICs place a computational burden on baseband processors when tasks such as configuring the ETIC for a frequency band transition occur. As such, there is a need for at least a sharing of the computational burden by the ETIC.

SUMMARY

An envelope tracking integrated circuit having a tracker circuitry configured to generate a modulated supply voltage for a radio frequency power amplifier in response to an envelope of a radio frequency signal to be amplified by the radio frequency power amplifier is disclosed. Also included is a charge pump system configured to generate a tracker supply voltage for the tracker circuitry. Further included is an analog multiplexer configured to receive the tracker supply voltage and a battery source voltage and output a selected one of the tracker supply voltage and the battery source voltage in response to a voltage select signal. A digital processor further included in the envelope tracking integrated circuit is configured to control portions of the tracker circuitry and to be powered by the selected one of the tracker supply voltage and the battery source voltage during transmission gaps when the radio frequency signal is not transmitted.

In exemplary embodiments, the envelope tracking integrated circuit further includes a memory that communicates over a bus with the digital processor. The envelope tracking integrated circuit also includes linear regulators that provide regulated voltages to power the digital processor and memory. The linear regulators are configured to receive a selected one of the battery source voltage and the lower supply voltage. Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure and, together with the description, serve to explain the principles of the disclosure.

DETAILED DESCRIPTION

Figure 1:
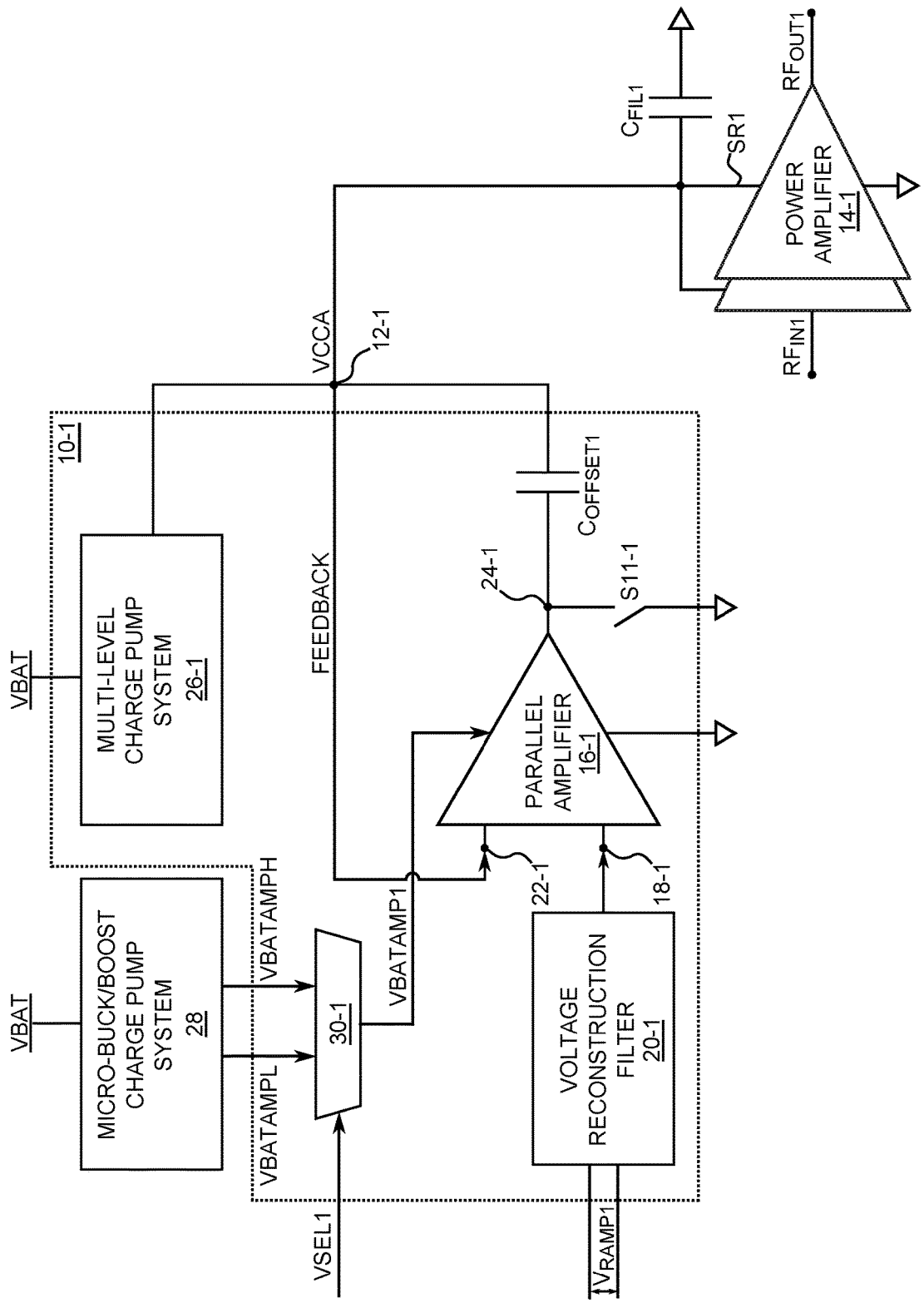
FIG. 1 is a block diagram of a first tracker of a dual tracker type envelope tracking integrated circuit.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

FIG. 1 is a block diagram of a first tracker circuitry 10-1 of a dual tracker type envelope tracking integrated circuit (ETIC) having a first supply output 12-1 that is coupled to a first supply rail SR1 of a first power amplifier 14-1. A first filter capacitor $C_{FIL1}$ is coupled between the first supply rail SR1 and a fixed voltage node such as ground. The first power amplifier 14-1 receives an RF signal to be amplified on a first RF input terminal $RF_{IN1}$ and outputs an amplified version of the RF signal on a first RF output terminal $RF_{OUT1}$.

The first tracker circuitry 10-1 also includes a first parallel amplifier 16-1 that is configured to control a first modulated voltage VCCA that supplies power to the first power amplifier 14-1. The first parallel amplifier 16-1 has a first signal input terminal 18-1 coupled to a first voltage reconstruction filter 20-1 that outputs a reconstructed and filtered version of a first envelope tracking signal $V_{RAMP1}$ that the first parallel amplifier 16-1 amplifies to modulate power being supplied to the first power amplifier 14-1. The first parallel amplifier 16-1 has a first feedback input terminal 22-1 that is coupled to the first supply output 12-1. Feedback from the first supply output 12-1 forces an output voltage at a first output terminal 24-1 of the first parallel amplifier 16-1 to follow the first envelope tracking signal $V_{RAMP1}$. A first offset capacitor $C_{OFFSET1}$ is coupled between the first output terminal 24-1 and the first supply output 12-1. A first discharge switch S11-1 is coupled between the first output terminal 24-1 and the fixed voltage node. The first discharge switch S11-1 may be momentarily closed to discharge the first offset capacitor $C_{OFFSET1}$.

A first multi-level charge pump system 26-1 provides power to the first power amplifier 14-1 through the first supply output 12-1. Raw power for the first multi-level charge pump system 26-1 is typically provided by a battery source voltage VBAT. The battery source voltage VBAT may also provide power through a micro-buck/boost charge pump system 28 that generates both a lower supply voltage VBATAMPL and a higher supply voltage VBATAMPH. A first analog multiplexer 30-1 receives the lower supply voltage VBATAMPL and the higher supply voltage VBATAMPH. A voltage select signal VSEL1 is received by the first analog multiplexer 30-1 to select either of the lower supply voltage VBATAMPL or the higher supply voltage VBATAMPH to provide a first tracker supply voltage VBATAMP1 to power the first parallel amplifier 16-1.

Figure 2:
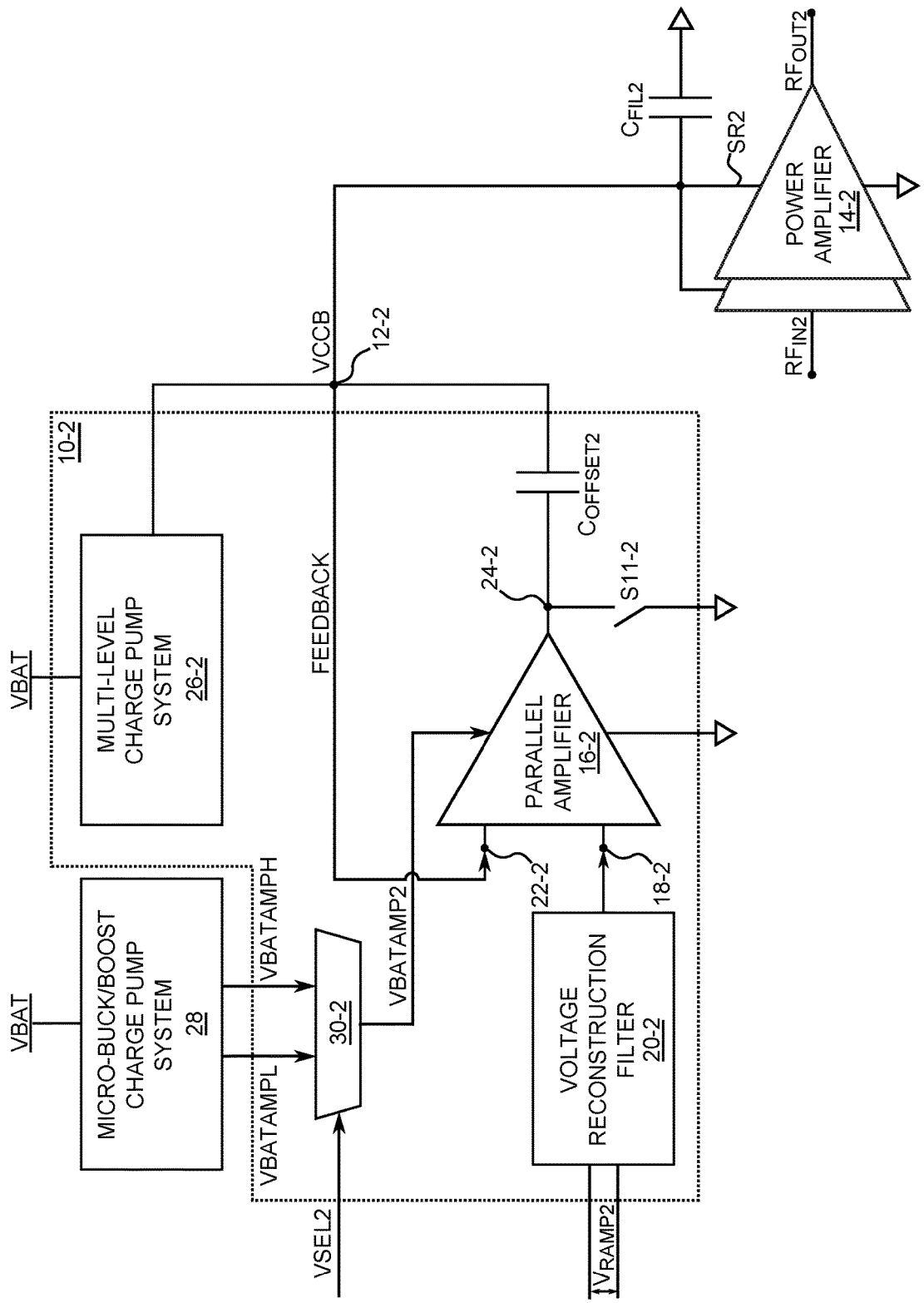
FIG. 2 is a block diagram of a second tracker that is structured similarly to the first tracker.

FIG. 2 is a block diagram of a second tracker circuitry 10-2 having a second supply output 12-2 that is coupled to a second supply rail SR2 of a second power amplifier 14-2. A second filter capacitor $C_{FIL2}$ is coupled between the second supply rail SR2 and the fixed voltage node, which in this exemplary embodiment is ground. The second power amplifier 14-2 receives an RF signal to be amplified on a second RF input terminal $RF_{IN2}$ and outputs an amplified version of the RF signal on a second RF output terminal $RF_{OUT2}$.

The second tracker circuitry 10-2 also includes a second parallel amplifier 16-2 that is configured to control a second modulated voltage VCCB that supplies power to the second power amplifier 14-2. The second parallel amplifier 16-2 has a second signal input terminal 18-2 coupled to a second voltage reconstruction filter 20-2 that outputs a reconstructed and filtered version of an second envelope tracking signal $V_{RAMP2}$ that the second parallel amplifier 16-2 amplifies to modulate power being supplied to the second power amplifier 14-2. The second parallel amplifier 16-2 has a second feedback input terminal 22-2 that is coupled to the second supply output 12-2. Feedback from the second supply output 12-2 forces an output voltage at a second output terminal 24-2 of the second parallel amplifier 16-2 to follow the second envelope tracking signal $V_{RAMP2}$. A second offset capacitor $C_{OFFSET2}$ is coupled between the second output terminal 24-2 and the second supply output 12-2. A second discharge switch S11-2 is coupled between the second output terminal 24-2 and the fixed voltage node. The second discharge switch S11-2 may be momentarily closed to discharge the second offset capacitor $C_{OFFSET2}$. The first parallel amplifier 16-1 and the second parallel amplifier 16-2 may also be referred to as tracker amplifiers.

A second multi-level charge pump system 26-2 provides power to the second power amplifier 14-2 through the second supply output 12-2. Raw power for the second multi-level charge pump system 26-2 is typically provided by the battery source VBAT. A second analog multiplexer 30-2 receives the lower supply voltage VBATAMPL and the higher supply voltage VBATAMPH from the micro-buck/boost charge pump system 28. A second voltage select signal VSEL2 is received by the second analog multiplexer 30-2 to select either of the lower supply voltage VBATAMPL or the higher supply voltage VBATAMPH to provide a second tracker supply voltage VBATAMP2 to power the second parallel amplifier 16-2.

Figure 3:
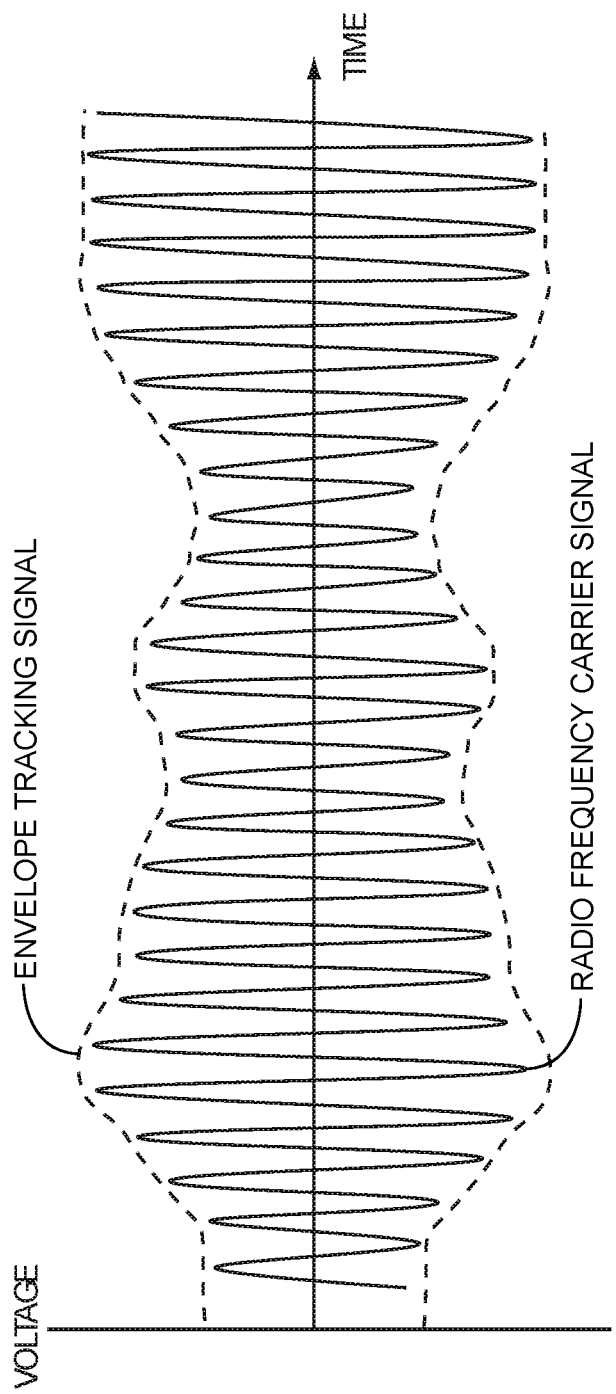
FIG. 3 is an exemplary diagram of an envelope tracking signal that tracks amplitude modulation of a radio frequency signal that is amplified by one or more amplifier stages.

FIG. 3 is an exemplary diagram of an envelope tracking signal that tracks amplitude modulation of a radio frequency carrier signal that is amplified by one or more amplifier stages such as the first power amplifier 14-1 (FIG. 1). It is desirable for the envelope tracking signal to be in synchronization with the amplitude modulation of the radio frequency signal. However, with regard to very wide modulation bandwidth such as 5G-NR 100 MHz, a problem exists in that a computational burden on baseband processors when tasks such as configuring envelope tracking integrated circuits for a frequency band transition. As such, there is an increasing need to share the computational burden of the baseband processors with envelope tracking integrated circuits.

Figure 4:
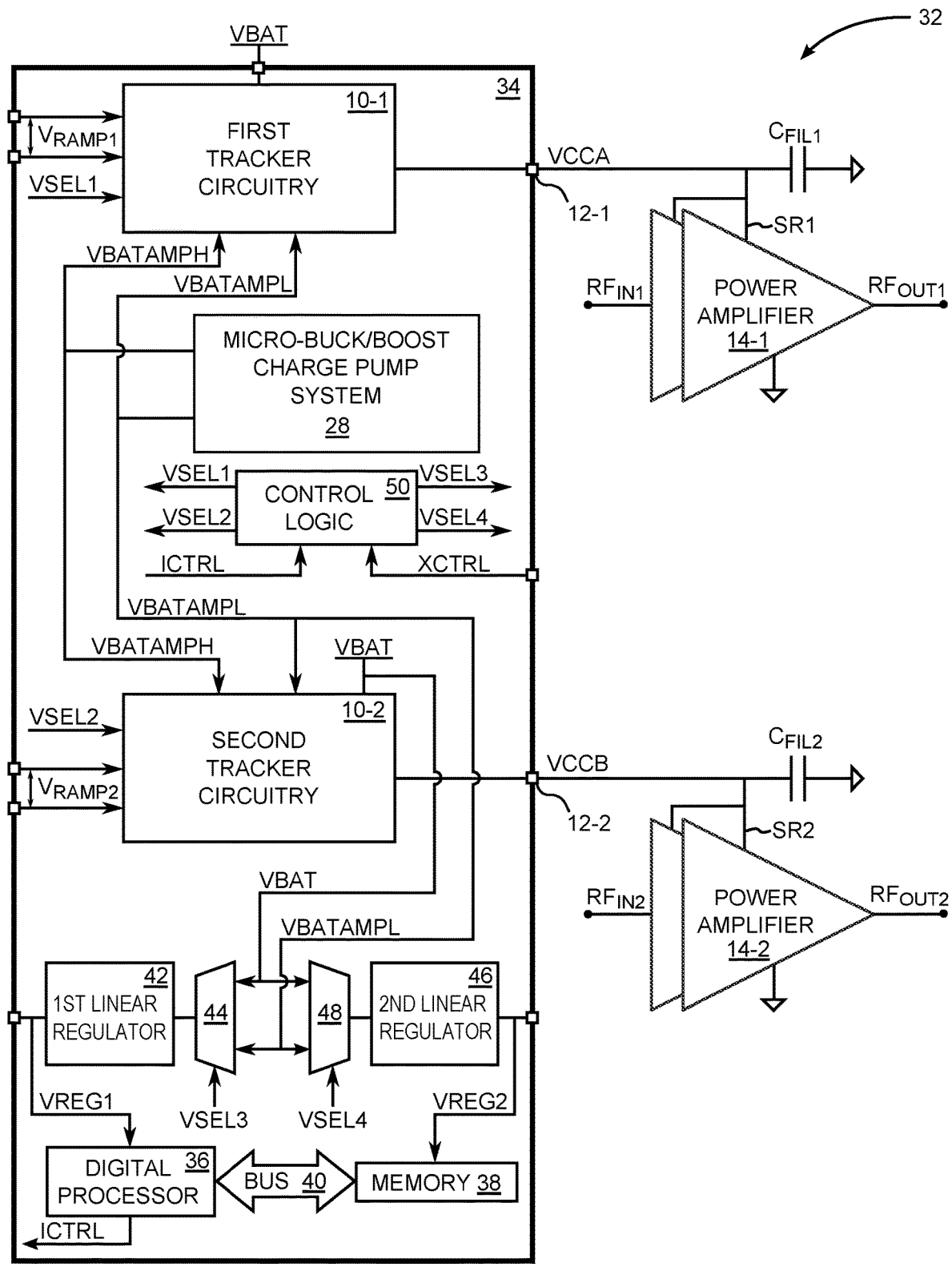
FIG. 4 is a block diagram that depicts an envelope tracking system that includes an envelope tracking integrated circuit that integrates a digital processor and memory with the first tracker and the second tracker.

In this regard, FIG. 4 is a diagram that depicts an envelope tracking system 32 that includes an envelope tracking integrated circuit (ETIC) 34 that integrates the first tracker circuitry 10-1 and the second tracker circuitry 10-2. The ETIC 34 has a first mode in which only one of the first tracker circuitry 10-1 and the second tracker circuitry 10-2 is supplying voltage (e.g., VCCA or VCCB) and a second mode in which the first tracker circuitry 10-1 and the second tracker circuitry 10-2 are both supplying voltages VCCA and VCCB, respectively. The ETIC 34 also includes an integrated digital processor 36 for performing calculations necessary during transmission gaps due to a change in operating frequency and/or a band transition.

The ETIC 34 further includes an integrated memory 38 that communicates with the digital processor 36 over a communication bus 40. The digital processor 36 relieves processing burdens from a baseband processor by controlling various settings for the ETIC 34 during operations such as frequency band transitions. For example, the digital processor 36 may switch between the first mode in which only one of the first tracker circuitry 10-1 and the second tracker circuitry 10-2 is supplying voltage (e.g., VCCA or VCCB) and the second mode in which the first tracker circuitry 10-1 and the second tracker circuitry 10-2 are both supplying voltages VCCA and VCCB, respectively. In another example, the digital processor 36 may configure switch settings for the first discharge switch S11-1 and the second discharge switch S11-2 during transitions between an envelope tracking mode and an average tracking mode. The memory 38 may have a flash memory block that holds instructions for the digital processor 36. The memory 38 may also include random access memory for holding variable values related to switch settings and operation status.

A first linear regulator 42 provides a first regulated voltage VREG1 to power the digital processor 36. The first linear regulator 42 is configured to receive a selected one of the battery source voltage VBAT and the lower supply voltage VBATAMPL. A third analog multiplexer 44 is configured to receive the battery source voltage VBAT and the lower supply voltage VBATAMPL and in response to a third voltage select signal VSEL3 output either zero volts or the selected one of the battery source voltage VBAT and the lower supply voltage VBATAMPL to an input of the first linear regulator 42. The digital processor 36 is placed in an off state when zero volts is selected.

A second linear regulator 46 provides a second regulated voltage VREG2 to power the memory 38. The second linear regulator 46 is configured to receive the selected one of the battery source voltage VBAT and the lower supply voltage VBATAMPL. A fourth analog multiplexer 48 is configured to receive the battery source voltage VBAT and the lower supply voltage VBATAMPL and in response to a fourth voltage select signal VSEL4 output either zero volts or the selected one of the battery source voltage VBAT and the lower supply voltage VBATAMPL to an input of the second linear regulator 46. In exemplary embodiments, the first linear regulator 42 and the second linear regulator 46 are of the low-dropout voltage regulator type.

In an exemplary embodiment, control logic 50 is configured to generate the first voltage select signal VSEL1, the second voltage select signal VSEL2, the third voltage select signal VSEL3, and the fourth voltage select signal VSEL4 in response to an internal control signal ICTRL and/or an external control signal XCTRL. The internal control signal ICTRL is generated on-chip using any criterion that indicates a demand for transmission of signals amplified by either or both of the first power amplifier 14-1 and the second power amplifier 14-2. Exemplary criteria may be a presence or absence of the first envelope tracking signal $V_{RAMP1}$ and/or the second envelope tracking signal $V_{RAMP2}$. The control logic 50 may be implemented as a look-up table and/or comprise logic gates such as NAND and NOR gates that are coupled together in a configuration that generates the first voltage select signal VSEL1, the second voltage select signal VSEL2, the third voltage select signal VSEL3, and the fourth voltage select signal VSEL4.

An external processor (not shown) such as a baseband processor in some exemplary embodiments generates the external control signal XCTRL to indicate when transmission of signals amplified by either or both of the first power amplifier 14-1 and the second power amplifier 14-2 is occurring. In the exemplary embodiment of FIG. 4, the internal control signal ICTRL and the external control signal XCTRL are logic state signals that transition between a logic low level and a logic high level. For example, 0 V may be a logic low level representing a digital logic 0, while 3 V may be a logic high level representing a digital logic 1.

Figure 5:
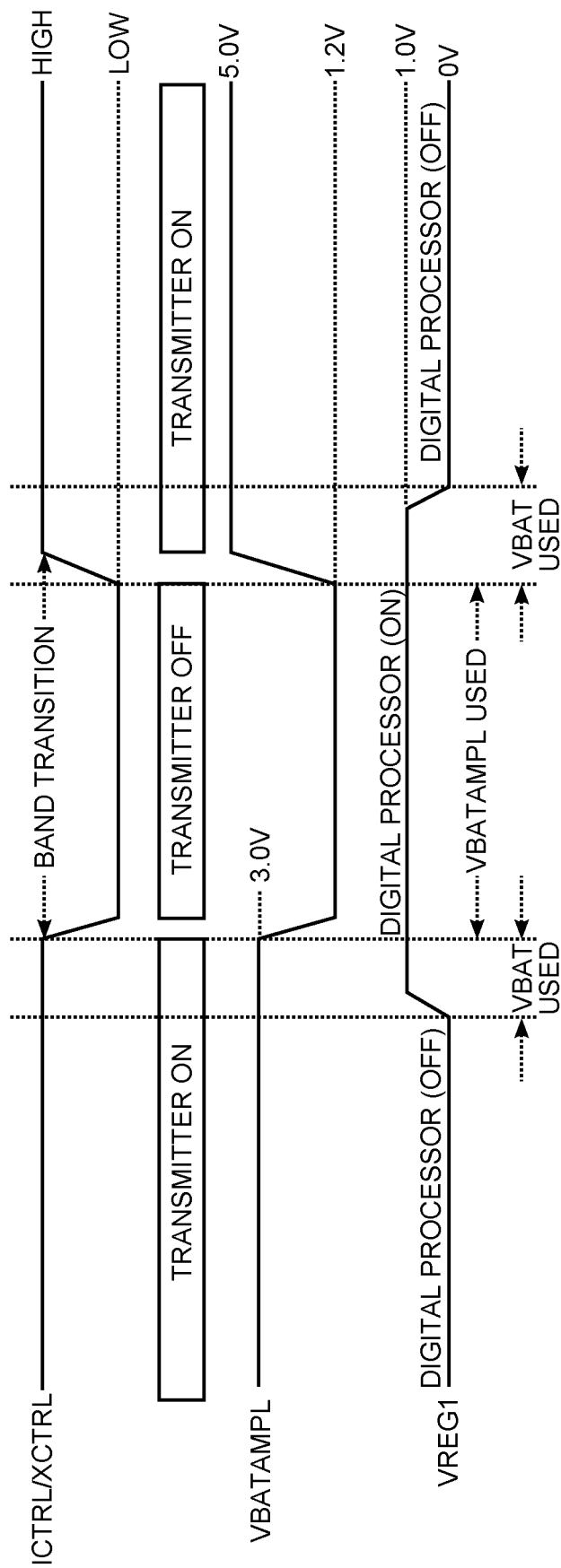
FIG. 5 is an exemplary control/response timing and voltage level diagram for logic states and voltages powering the digital processor during operation of the envelope tracking integrated circuit.

FIG. 5 is an exemplary control/response timing and voltage level diagram for logic states and voltages powering the digital processor during operation of the envelope tracking integrated circuit. When a transmitter is on and transmitting signals amplified by either or both of the first power amplifier 14-1 and the second power amplifier 14-2, the lower supply voltage VBATAMPL is set by a minimum target voltage for correct operation of envelope tracking performed by the first parallel amplifier 16-1 and the second parallel amplifier 16-2. Moreover, when the transmitter is on, the first linear regulator 42 is either off, which is typically most of this time, or is powered by the battery source voltage VBAT just prior to a transition to transmitter off. Then, as a transmission gap occurs due to a band transition and/or transmission protocol change, the lower supply voltage VBATAMPL may be set to a relatively much lower level and selected by the control logic 50 to power the first linear regulator 42 and the second linear regulator 46. During the transmission gap period, depicted as an exemplary band transition in FIG. 4, the first regulated voltage VREG1 powering the digital processor 36 and the second regulated voltage VREG2 powering the memory 38 are derived from the lower supply voltage VBATAMPL generated by the micro-buck/boost charge pump system 28. At the end of the transmission gap, the battery source voltage VBAT is briefly used as the lower supply voltage VBATAMPL is raised to a higher level such as 5.0 V in preparation for turning the transmitter on and the digital processor 36 off.

Those skilled in the art will recognize improvements and modifications to the preferred embodiments of the present disclosure. All such improvements and modifications are considered within the scope of the concepts disclosed herein and the claims that follow.

What is claimed is:

1. An envelope tracking integrated circuit comprising:
   a first tracker circuitry configured to generate a first modulated supply voltage for a first radio frequency power amplifier in response to an envelope of a radio frequency signal to be amplified by the first radio frequency power amplifier;
   a charge pump system configured to generate a tracker supply voltage for the first tracker circuitry;
   a first analog multiplexer configured to receive the tracker supply voltage and a battery source voltage and output a selected one of the tracker supply voltage and the battery source voltage in response to a voltage select signal; and
   a digital processor configured to control portions of the first tracker circuitry and be powered by the selected one of the tracker supply voltage and the battery source voltage during transmission gaps when the radio frequency signal is not transmitted.

2. The envelope tracking integrated circuit of claim 1 further comprising a first linear regulator configured to receive and regulate the selected one of the tracker supply voltage and the battery source voltage and thereby provide a first regulated voltage to power the digital processor.

3. The envelope tracking integrated circuit of claim 2 wherein the first linear regulator is a low-dropout voltage regulator.

4. The envelope tracking integrated circuit of claim 1 further comprising:
   a second analog multiplexer configured to receive the tracker supply voltage and a battery source voltage and output the selected one of the tracker supply voltage and the battery source voltage in response to the voltage select signal; and
   a memory configured to hold instructions for the digital processor and to be powered by the selected one of the tracker supply voltage and the battery source voltage during transmission gaps when the radio frequency signal is not transmitted.

5. The envelope tracking integrated circuit of claim 4 further comprising a second linear regulator configured to receive and regulate the selected one of the tracker supply voltage and the battery source voltage and thereby provide a second regulated voltage to power the memory.

6. The envelope tracking integrated circuit of claim 5 wherein the second linear regulator is a low-dropout voltage regulator.

7. The envelope tracking integrated circuit of claim 1 wherein the first tracker circuitry comprises a multi-level charge pump system configured to generate and provide a supply voltage at a first supply output.

8. The envelope tracking integrated circuit of claim 1 wherein the first tracker circuitry comprises a first parallel amplifier having:
   a first amplifier input terminal coupled to a first supply output to receive a first feedback signal;
   a second amplifier input terminal configured to receive a first envelope tracking signal; and
   an output terminal communicatively coupled to the first supply output, wherein the first parallel amplifier is configured to provide the first modulated supply voltage at the first supply output in response to a difference between the first envelope tracking signal and the first feedback signal.

9. The envelope tracking integrated circuit of claim 8 further including a capacitor coupled between the output terminal of the first parallel amplifier and the first supply output.

10. The envelope tracking integrated circuit of claim 1 further comprising a second tracker circuitry configured to generate a second modulated supply voltage for a second radio frequency power amplifier in response to an envelope of a radio frequency signal to be amplified by the second radio frequency power amplifier.

11. The envelope tracking integrated circuit of claim 10 wherein the second tracker circuitry comprises a multi-level charge pump system configured to supply voltage at a second supply output.

12. The envelope tracking integrated circuit of claim 10 wherein the second tracker circuitry comprises a second parallel amplifier having:
   a first amplifier input terminal coupled to a second supply output to receive a second feedback signal;
   a second amplifier input terminal configured to receive a second envelope tracking signal; and
   an output terminal communicatively coupled to the second supply output, wherein the second parallel amplifier is configured to provide a second modulated supply voltage at the second supply output in response to a difference between the second envelope tracking signal and the second feedback signal.

13. The envelope tracking integrated circuit of claim 12 further including a capacitor coupled between the output terminal of the second parallel amplifier and the second supply output.

14. An envelope tracking integrated circuit comprising:
   a first tracker circuitry configured to generate a first modulated supply voltage for a first radio frequency power amplifier in response to an envelope of a radio frequency signal to be amplified by the first radio frequency power amplifier;
   a charge pump system configured to generate a tracker supply voltage for the first tracker circuitry;
   a first analog multiplexer configured to receive the tracker supply voltage and a battery source voltage and output a selected one of the tracker supply voltage and the battery source voltage in response to a voltage select signal;
   a digital processor configured to control portions of the first tracker circuitry and be powered by the selected one of the tracker supply voltage and the battery source voltage during transmission gaps when the radio frequency signal is not transmitted;
   a second analog multiplexer configured to receive the tracker supply voltage and a battery source voltage and output the selected one of the tracker supply voltage and the battery source voltage in response to the voltage select signal; and
   a memory configured to hold instructions for the digital processor and be powered by the selected one of the tracker supply voltage and the battery source voltage during transmission gaps when the radio frequency signal is not transmitted.

15. The envelope tracking integrated circuit of claim 14 further comprising control logic configured to generate voltage selection signals for the first analog multiplexer and the second analog multiplexer in response to a control signal indicating a transmission gap.

16. The envelope tracking integrated circuit of claim 14 further comprising a first linear regulator configured to receive and regulate the selected one of the tracker supply voltage and the battery source voltage and thereby provide a first regulated voltage to power the digital processor.

17. The envelope tracking integrated circuit of claim 16 further comprising a second linear regulator configured to receive and regulate the selected one of the tracker supply voltage and the battery source voltage and thereby provide the first regulated voltage to power the memory.

18. The envelope tracking integrated circuit of claim 17 wherein the first linear regulator and the second linear regulator are low-dropout voltage regulators.

19. The envelope tracking integrated circuit of claim 14 wherein the first tracker circuitry comprises a first parallel amplifier having:
- a first amplifier input terminal coupled to a first supply output to receive a first feedback signal;
- a second amplifier input terminal configured to receive a first envelope tracking signal; and
- an output terminal communicatively coupled to the first supply output, wherein the first parallel amplifier is configured to provide the first modulated supply voltage at the first supply output in response to a difference between the first envelope tracking signal and the first feedback signal.

20. The envelope tracking integrated circuit of claim 14 further comprising a second tracker circuitry configured to generate a second modulated supply voltage for a second radio frequency power amplifier in response to an envelope of a radio frequency signal to be amplified by the second radio frequency power amplifier.

21. The envelope tracking integrated circuit of claim 20 wherein the second tracker circuitry comprises a second parallel amplifier having:
- a first amplifier input terminal coupled to a second supply output to receive a second feedback signal;
- a second amplifier input terminal configured to receive a second envelope tracking signal; and
- an output terminal communicatively coupled to the second supply output, wherein the second parallel amplifier is configured to provide a second modulated supply voltage at the second supply output in response to a difference between the second envelope tracking signal and the second feedback signal.

* * * * *